United States Patent [19]

Frey

[11] Patent Number: 4,495,640

[45] Date of Patent: Jan. 22, 1985

[54] ADJUSTABLE DISTORTION GUITAR AMPLIFIER

[76] Inventor: Douglas R. Frey, 1980C Allwood Dr., Bethlehem, Pa. 18018

[21] Appl. No.: 392,538

[22] Filed: Jun. 28, 1982

[51] Int. Cl.³ .............................................. H03G 3/00
[52] U.S. Cl. ...................................... 381/61; 381/98; 381/103; 381/118; 381/121; 333/28 T; 333/172; 84/1.24
[58] Field of Search .......... 381/120, 121, 118, 98–109, 381/63–65, 61; 84/1.19, 1.24; 333/18, 28 R, 28 T, 167, 172; 330/254, 260, 282, 295, 302–304, 86, 110

[56] References Cited

U.S. PATENT DOCUMENTS

| 4,143,245 | 3/1979 | Scholz | 381/118 X |
| 4,166,197 | 8/1979 | Moog et al. | 381/101 |
| 4,292,467 | 9/1981 | Olden et al. | 381/101 X |
| 4,363,001 | 12/1982 | Suzuki et al. | 381/101 X |
| 4,405,832 | 9/1983 | Sondermeyer | 84/1.24 X |

Primary Examiner—Gene Z. Rubinson
Assistant Examiner—W. J. Brady

[57] ABSTRACT

A programmable adjustable distortion amplifier circuit has a first channel having an adjustable gain and a filter for filtering high and low frequency components of signal processed by the first channel, a second channel having an adjustable gain and a filter for filtering high and low frequency components of signal processed by the second channel, a parametric equalizer providing adjustable preselectable frequency bandwidth and a vacuum tube amplifier and support circuitry permitting adjustment of distortion of signal processed by the second channel by a preselected amount. An optional phase shift circuit delays a portion of signal processed by the second channel with the delayed portion provided to the second channel downstream of the parametric equalizer but upstream of the tube. A summing device combines output signals of the first and second channels for input to an adjustable gain control for subsequent input to audio speakers. Switches produce input signals for adjustably preselecting bandwidth of the parametric equalizer, amplitude of the parametric equalizer output and distortion introduced by the tube and support circuitry. A memory stores a plurality of input signals received from the switches and allows selection among the plurality of stored signals for input to the parametric equalizer and to the tube. These input signals control bandwidth of signal having amplitude controlled by the parametric equalizer, amplitude of the parametric equalizer output and the amount of distortion introduced by the tube. The individual circuit components may stand alone and function independently of one another.

18 Claims, 7 Drawing Figures

ADJUSTABLE DISTORTION GUITAR AMPLIFIER

SUMMARY OF THE INVENTION

This invention provides a programmable adjustable distortion amplifier circuit, adapted especially well for amplifying guitar music, having a first channel including means for controlling gain and means for filtering high and low frequency components of signal processed by the first channel, a second channel including means for adjustably controlling second channel gain, means for adjustably filtering high and low frequency components of signal processed by the second channel, means for selectably controlling amplitude of signal processed by the second channel within an adjustably preselected frequency bandwidth, means for varying distortion of signal processed by the second channel by an adjustably preselected amount, means for delaying a portion of the signal processed by the second channel with the delayed portion being provided to the second channel downstream of the amplitude controlling means but upstream of the distortion varying means and means for combining output signals of the first and second channels and feeding the combined output signals of the first and second channels to adjustable gain control means for subsequent input to audio speakers.

Switching means produce input signals for adjustably preselecting bandwidth of the amplitude controlling means, amplitude of signal output from the selectably controllable amplitude controlling means and the amount of distortion introduced to the signal by said distortion varying means. Memory means store a plurality of input signals received from the switching means; means are provided for selecting among the plurality of stored input signals and delivering the selected signal to the selectably controllable amplitude control means and the distortion varying means thereby to affect the bandwidth of the signal whose amplitude is controlled by said selectably controllable amplitude controlling means, the amplitude of the signal output by the selectably controllable amplitude controlling means and the amount of distortion introduced to the signal by the distortion means.

Optionally provided is a second means for introducing distortion of predetermined fixed amount into signal processed by the second channel. When the second distortion introducing means is used, switching means are also provided to produce an input signal for selectably coupling the second distortion introducing means into the second channel at a position upstream of said selectably controllable amplitude controlling means.

The invention is not limited to two channel amplifiers and may be embodied as a single channel adjustable distortion amplifier including means for adjustably controlling the amplifier gain, means for adjustable filtering high and low frequency components of a signal processed by the amplifier, means for selectably controlling amplitude of signal processed by the amplifier within an adjustably preselected bandwidth centered about an adjustably preselected frequency, means for varying distortion and gain of signal processed by the amplifier by an adjustably preselected amount, means responsive to operator input for generating control signals for input to the amplitude controlling means thereby to define the adjustably preselected bandwidth and frequency about which the bandwidth is centered and for input to the distortion varying means to define the adjustable preselected amounts of distortion and gain of the distortion introducing means and memory means for storing a plurality of control signals and delivering selected control signals to the amplitude controlling means and to the distortion varying means in response to an operator supplied stimulus.

The invention further provides a programmable adjustable parametric equalizer. Moreover, the invention provides an adjustable bandwidth adjustable frequency filter means which may be part of the programmable adjustable parametric equalizer or may stand alone.

The invention further provides a circuit for introducing a preselected amount of distortion into an electric signal input thereto which circuit may optionally be used with the programmable adjustable distortion amplifier.

THE DRAWINGS

DETAILED DESCRIPTION OF THE INVENTION AND THE BEST MODE FOR PRACTICE THEREOF

Figure 1:
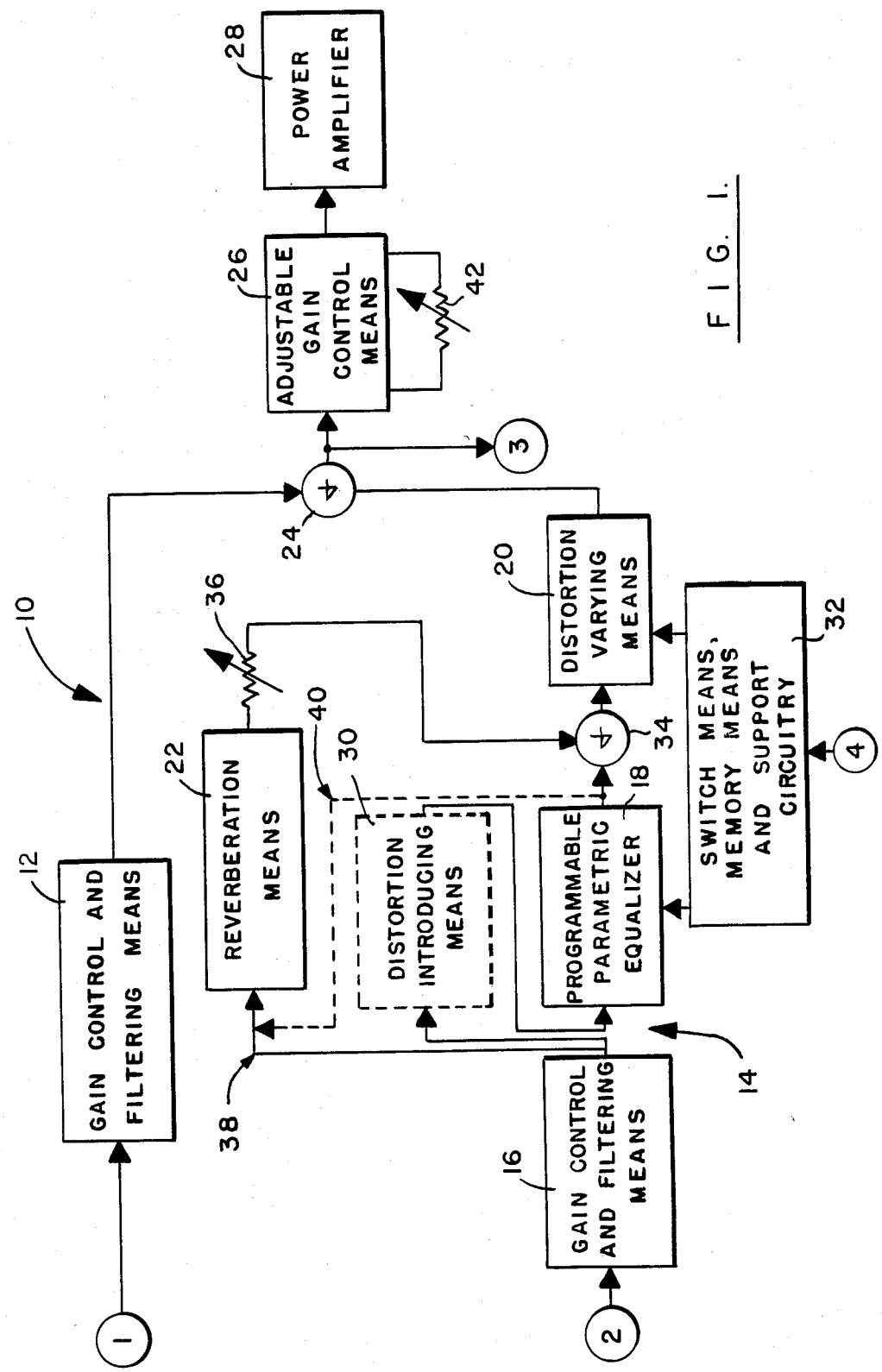
FIG. 1 is a schematic representation, in block diagram form, of circuitry embodying aspects of the invention.

FIG. 1 illustrates the preferred embodiment of the programmable adjustable distortion amplifier circuit of the invention which is adapted especially well for amplifying guitar music, in which a first amplifying channel is designated generally 10 and receives as input a signal, indicated by balloon 1, from a source of music, typically a guitar or a keyboard instrument. First channel 10 includes means for controlling gain of the first channel and means for filtering high and low frequency components of signal in the channel, which means are manifested as conventional volume, treble and bass controls collectively designated generally 12 in FIG. 1.

A second amplifying channel is designated generally 14 and receives as input a signal indicated by balloon 2, which may come from the same guitar as signal 1, from a second guitar, from a keyboard instrument, from a microphone or any other device producing an audio signal. Second channel 14 includes means for controlling gain thereof and means for adjustably filtering high and low frequency components of signal processed by channel 14 which means are manifested as conventional volume, treble and bass controls collectively generally designated 16 in FIG. 1.

Second channel 14 further includes means 18, in the form of a programmable parametric equalizer for selectably controlling amplitude of signal processed by second chanel 14 within an adjustable preselected frequency bandwidth, first means 20 for varying distortion of signal processed by second channel 14 by an adjustably preselectable amount and reverberation means 22 for delaying a portion of signal processed by second channel 14 and providing the delayed portion back to second channel 14 downstream of parametric equalizer means 18 but upstream of first distortion varying means 20. Output of second channel 14 as defined by output of first distortion varying means 20 is combined with output from first channel 10 by summing means 24 which provides the combined output to adjustable gain control means 26 which in turn provides input to power amplifier driving audio speakers, collectively designated schematically 28. Optionally, an intermediate output maybe provided to a preamplifier as indicated by balloon 3.

A second means 30 for introducing distortion of predetermined fixed amount into signal processed by second channel 14 may be provided prior to the input stage of parametric equalizer means 18. The optional nature of second distortion introduction means 30 is denoted by the dash line block in FIG. 1.

Manual inputs are provided to second channel 14 as indicated schematically at balloon 4. These include switch means for producing input digital control signals for adjustably preselecting bandwidth of parametric equalizer means 18, amplitude of signal output from parametric equalizer 18, frequency about which parametric equalizer 18 operates and amount of distortion introduced by first distortion introduction means 20. A memory stores a plurality of the signals received from the switch means. The switch means further include a manual switch for selecting one of the plurality of sets of stored input signals for input to parametric equalizer means 18 and distortion introduction means 20. The manual switch means, the memory means and the associated support circuitry are collectively designated generally 32 in FIG. 1.

From FIG. 1 solid line 38 indicates that input to reverberation means 22 is preferably provided from upstream of the input to parametric equalizer 18 and, if used, second distortion introducing means 30. Output from reverberation means 22 is preferably combined with output from parametric equalizer means 18 by summing means 34 to produce a combined signal for input to first distortion varying means 20. A variable resistor 36 may be provided receiving output from reverberation means 22 thereby to vary the amount of reverberation introduced into signal processed by second channel 14. An alternate input to reverberation means 22 is indicated by dash lines 40, providing signal output by parametric equalizer 18 as input to reverberation means 22.

A variable resistor 42 may be provided for adjustment of gain of control means 26.

Figure 2:
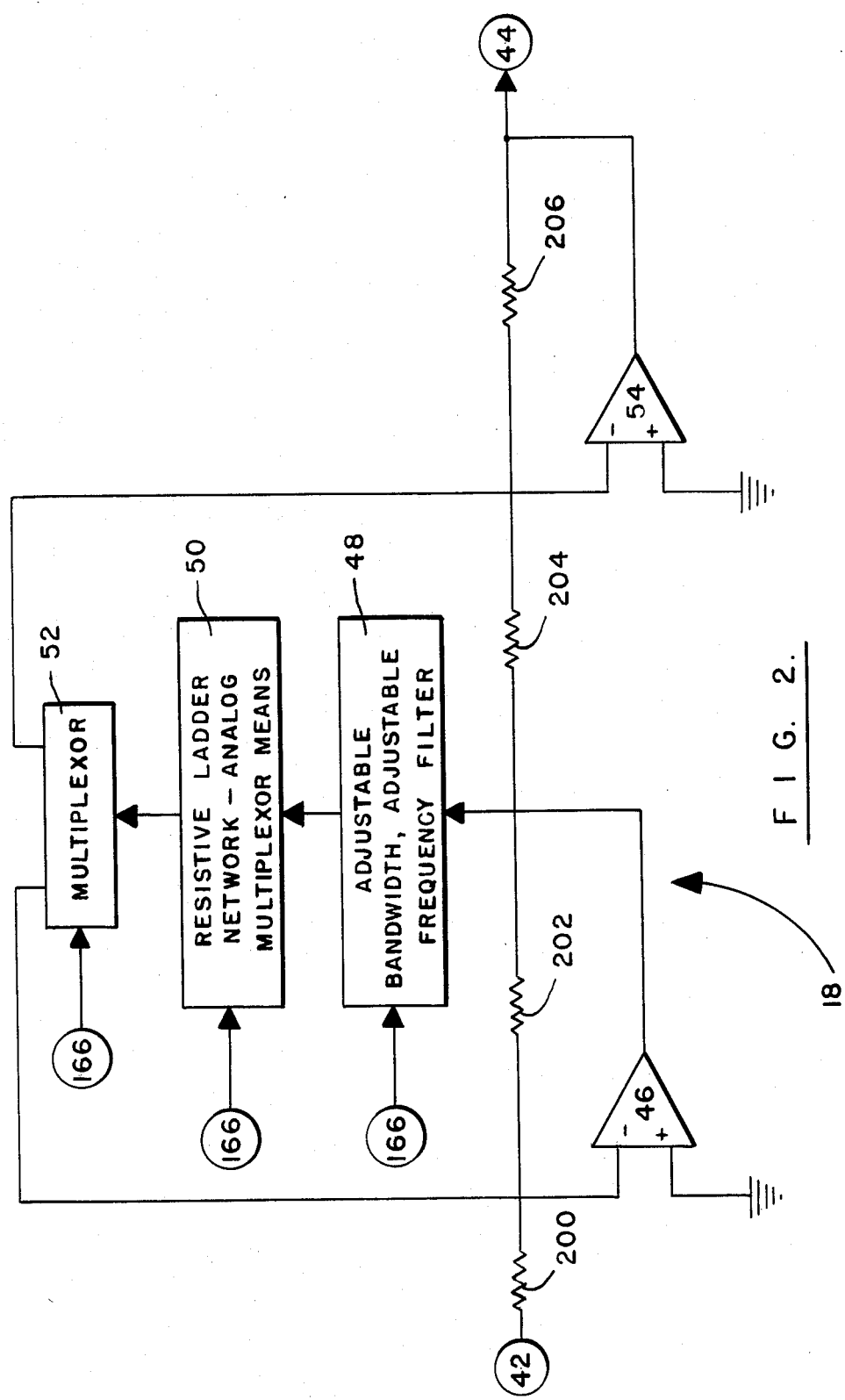
FIG. 2 is a schematic representation, partially in block diagram form of parametric equalizer circuitry embodying aspects of the invention.

Parametric equalizer means 18 is shown in greater detail in FIG. 2 where input thereto and output therefrom are respectively generally designated by balloons 42 and 44. Parametric equalizer means 18 permits selection of not only the amount of boost or suppression of the amplitude of signal processed by second channel 14 but also permits width of the boost curve and frequency about which the boost curve is centered to be adjusted. In FIG. 2 input signal at 42 is provided via a first resistor 200 to a first differential amplifier 46 at a first negative input terminal thereof. The second, positive input terminal of first differential amplifier 46 is connected to a reference signal, preferably ground as depicted in FIG. 2. Output of first differential amplifier 46 is connected with signal received via resistors 202, 204 and provided as input to an adjustable bandwidth adjustable frequency filter designated generally 48. Output of filter 48 is provided to a resistive ladder network-analog multiplexer combination means 50, described in more detail below, output of which is provided to a 2:1 multiplexer 52 having respective output terminals connected to respective negative input terminals of first differential amplifier 46 and a second differential amplifier 54. Multiplexer means 52 provides two output signals therefrom and acts as a potentiometer in that the sum of the output signals equals output from filter 48. The first output terminal of multiplexer means 52 is connected intermediate resistors 200, 202 at the point from which input to the negative input terminal of first differential amplifier 46 is taken. Similarly, output from second output terminal of multiplexer 52 is connected intermediate resistors 204, 206 to the point from which input to the negative input terminal of second differential amplifier 54 is taken.

Figure 3:
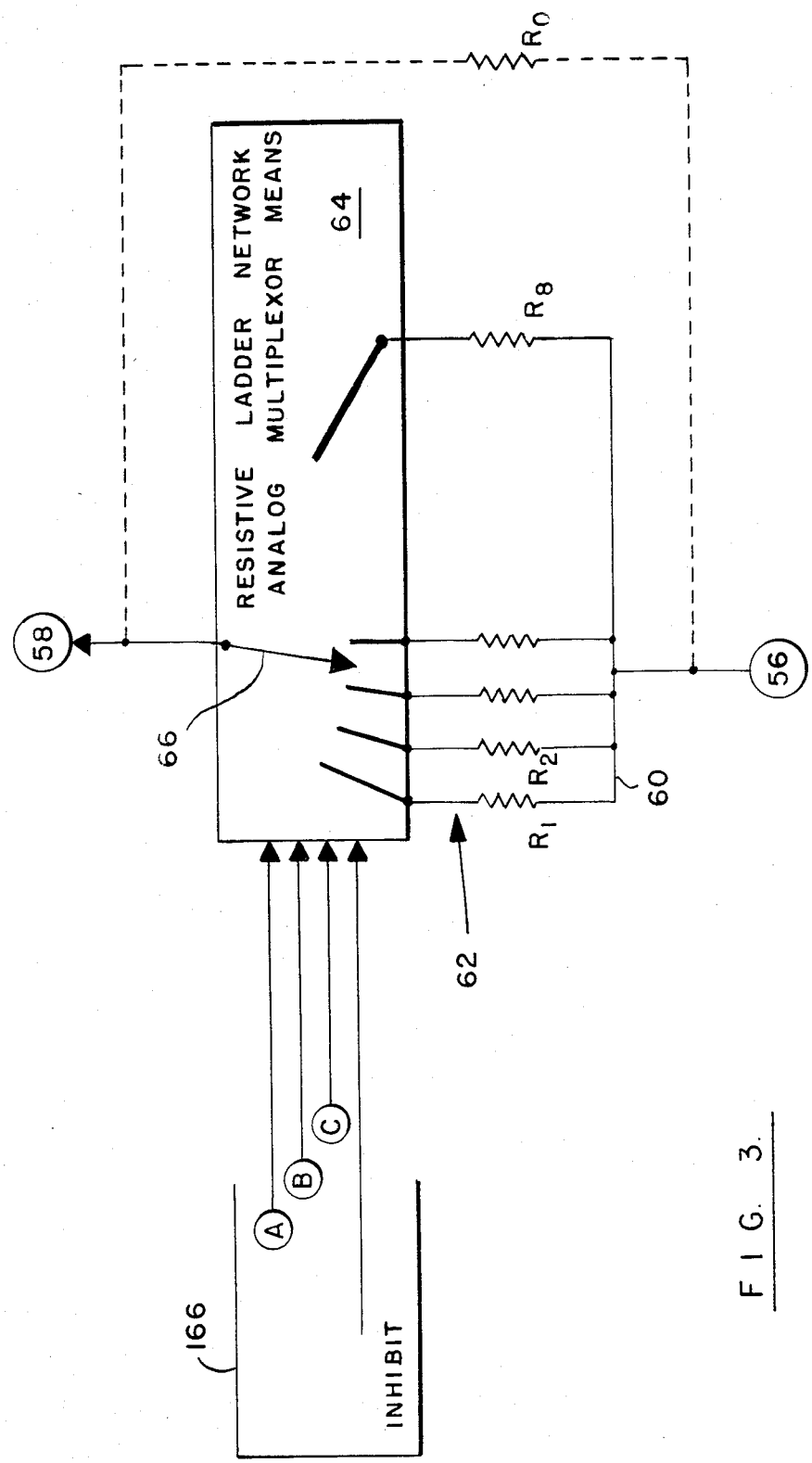
FIG. 3 is a schematic representation of an analog multiplexer-resistive ladder network combination used in circuitry disclosed herein embodying aspects of the invention.

Resistive ladder network-analog multiplexer means 50 is illustrated schematically in greater detail in FIG. 3 and includes input and output terminals indicated by balloons 56, 58 respectively. Input at 56 is provided to a common input rail 60 forming one side of a resistive ladder network designated generally 62. An 8:1 analog-multiplexer has 8 respective input terminals thereof connected to leads from resistors R1 through R8 of ladder network 62. Multiplexer 64 may be a CD4051 8:1 analog-multiplexer available from National Semiconductor, operating in response to digital input control voltages provided on control terminals labeled A, B, C and INHIBIT in FIG. 3. In this type of circuit the eight combinations defined by possible input of single bits to terminals A, B, and C select which of the eight input terminals of multiplexer 64 is connected to the output terminal thereof. When a bit is provided to the INHIBIT control terminal, none of the eight input terminals is connected to the output terminal. Multiplexer 64 is illustrated schematically in FIG. 3 as having a wiper arm 66 movable to contact the eight respective input terminals thereof which are numbered in FIG. 3. Illustration of the wiper arm is only to facilitate understanding of the function of multiplexer 64; no mechanical wiper arm is used in analog multiplexers such as the National Semiconductor CD4051; all switching internally of these elements is done electronically.

As illustrated in FIG. 3, optionally a bypass resistor $R_0$ may be provided in parallel with resistive ladder network 62 and multiplexer 64. The optional nature of $R_0$ is indicated by its dash line connection at balloons 56 and 58.

Figure 4:
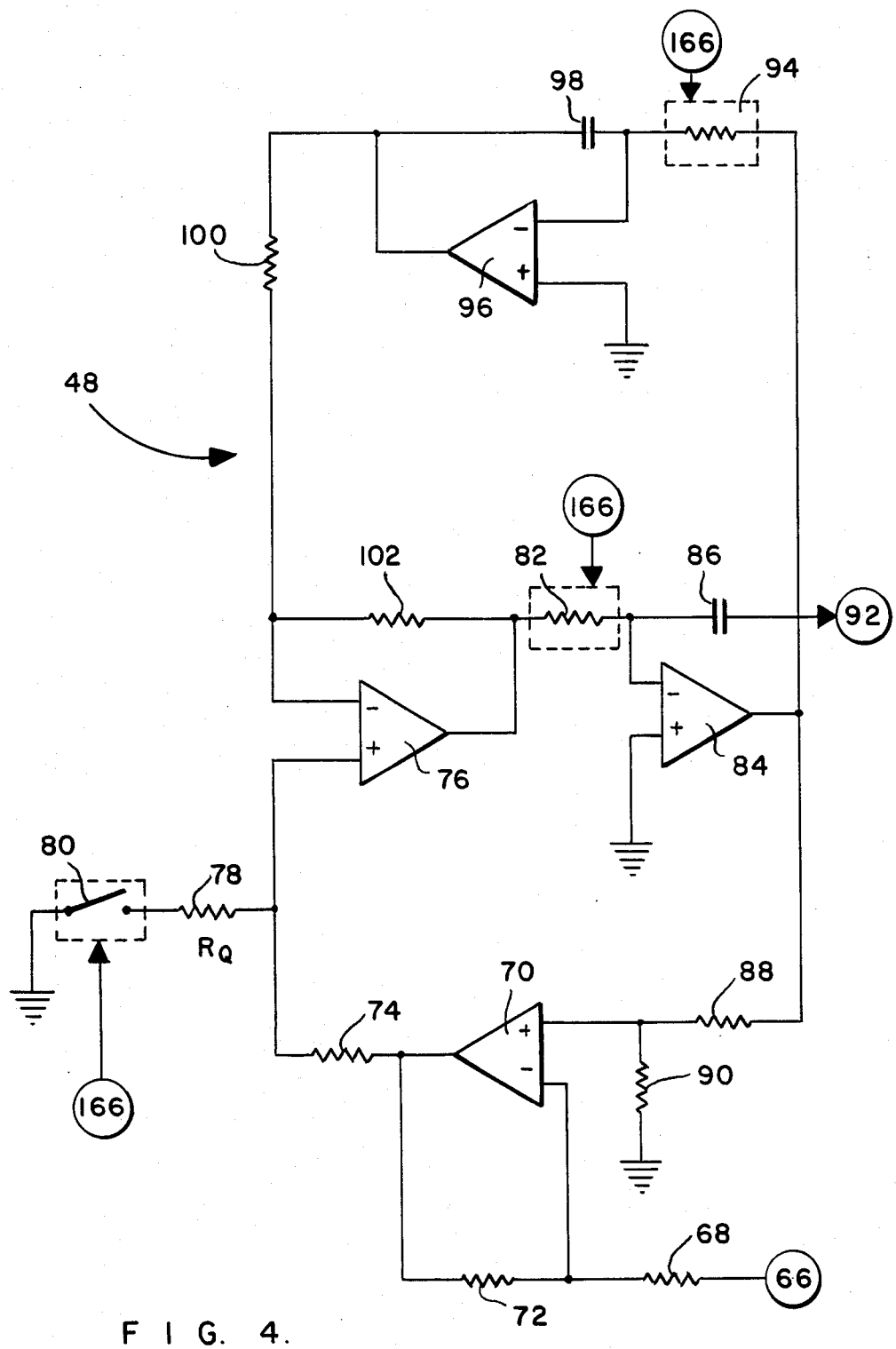
FIG. 4 is a schematic representation of variable bandwidth variable frequency filter circuitry embodying aspects of the invention.

FIG. 4 illustrates in greater schematic detail the variable bandwidth variable frequency filter denoted 48 in FIG. 2. Input signal to filter 48 is provided via an input terminal indicated by balloon 66, through resistor 68 to a negative input terminal of a third differential amplifier 70. Resistor 72 provides feedback of the output of third differential amplifier 70 to the negative input terminal thereof. Output of third differential amplifier 70 is provided via resistor 74 to a positive input terminal of a fourth differential amplifier 76.

Analog switch 80 in combination with control resistor 78, having resistive value $R_Q$, operate to determine the fraction of the output from third differential amplifier 70 which appears at the positive input terminal of fourth differential amplifier 76. Output of fourth differential amplifier 76 is provided via first frequency control resistive element 82, having resistance value $R_F$, to the negative input terminal of fifth differential amplifier 84. Output of fifth differential amplifier 84 is provided via a first feedback capacitor 86, having capacitance value $C_F$, to the negative input terminal of fifth differential amplifier 84. Output of fifth differential amplifier 84 is further provided via resistors 88, 90, which act as a voltage divider, to the positive input terminal of third differential amplifier 70.

Output of fifth differential amplifier 84, which defines the output of filter 48 as indicated at balloon 92, is also provided via a second frequency control reslstive element 94, having a resistance value $R_F$ preferably the same as first frequency control resistive element 82, to the negative input terminal of sixth differential amplifier 96. Output of sixth differential amplifier 96 is provided via second feedback capacitor 98, preferably having capacitance value $C_F$ in common with first feedback capacitor 86, to the negative input terminal of sixth differential amplifier 96. The positive input terminals of fifth and sixth differential amplifiers 84, 96 are connected to a reference voltage, depicted schematically as ground in FIG. 4. While it is, as noted, preferable that resistive elements 82, 94 have a common resistance value, this is not critical to the operation of the filter. Similarly, while it is preferable that capacitors 86, 98 have a common capacitance value, this is not critical to the operation of the filter.

Output of sixth differential amplifier 96 is further provided via resistor 100 to the negative input terminal of fourth differential amplifier 76. Output of fourth differential amplifier 76 is also provided via feedback resistor 102 to the negative input terminal of fourth differential amplifier 76.

Frequency control resistive elements 82, 94 are each preferably resistive ladder network-analog multiplexer combinations of the type illustrated in FIG. 3 where the corresponding resistors $R_1$ through $R_8$ of the respective ladder networks in elements 82, 94 are preferably the same resistance values and both analog multiplexers are controlled by a common digital input signal. Use of these resistive ladder network-analog multiplexer combinations as frequency control resistive elements permits the frequency about which filter 48 operates to be varied by applying a digital input signal to the A, B, C or INHIBIT terminals of the respective analog multiplexers thereby permitting selection of desired resistance values for resistive elements 82, 84. The square root of the product of the selected frequency control resistances 82, 94 and the selected frequency control capacitances 86, 98 defines the central frequency about which filter 48 operates.

The resistance value $R_Q$ of bandwidth control resistor 78 controls filter 48 bandwidth, i.e. the range of frequencies which are filtered. In the preferred embodiment of the invention the value of resistor 78 is fixed so that switch 80 associated with resistor 78 allows selection of two different bandwidths.

Switch 80 is preferably an analog switch controlled by a single bit while the analog multiplexers of resistive ladder network-analog multiplexer combinations 82, 94 are controlled by four common bits input to the respective A, B, C, and INHIBIT terminals thereof. Accordingly, five digital bits regulate operation of filter 48. Since five bits are required to regulate operation of resistive ladder networkanalog multiplexer combination 50 and 2:1 multiplexer means 52 forming a part of parametric equalizer 18, only ten digital bits are required to completely control operation of parametric equalizer 18, of which filter 48 forms a part.

Figure 5:
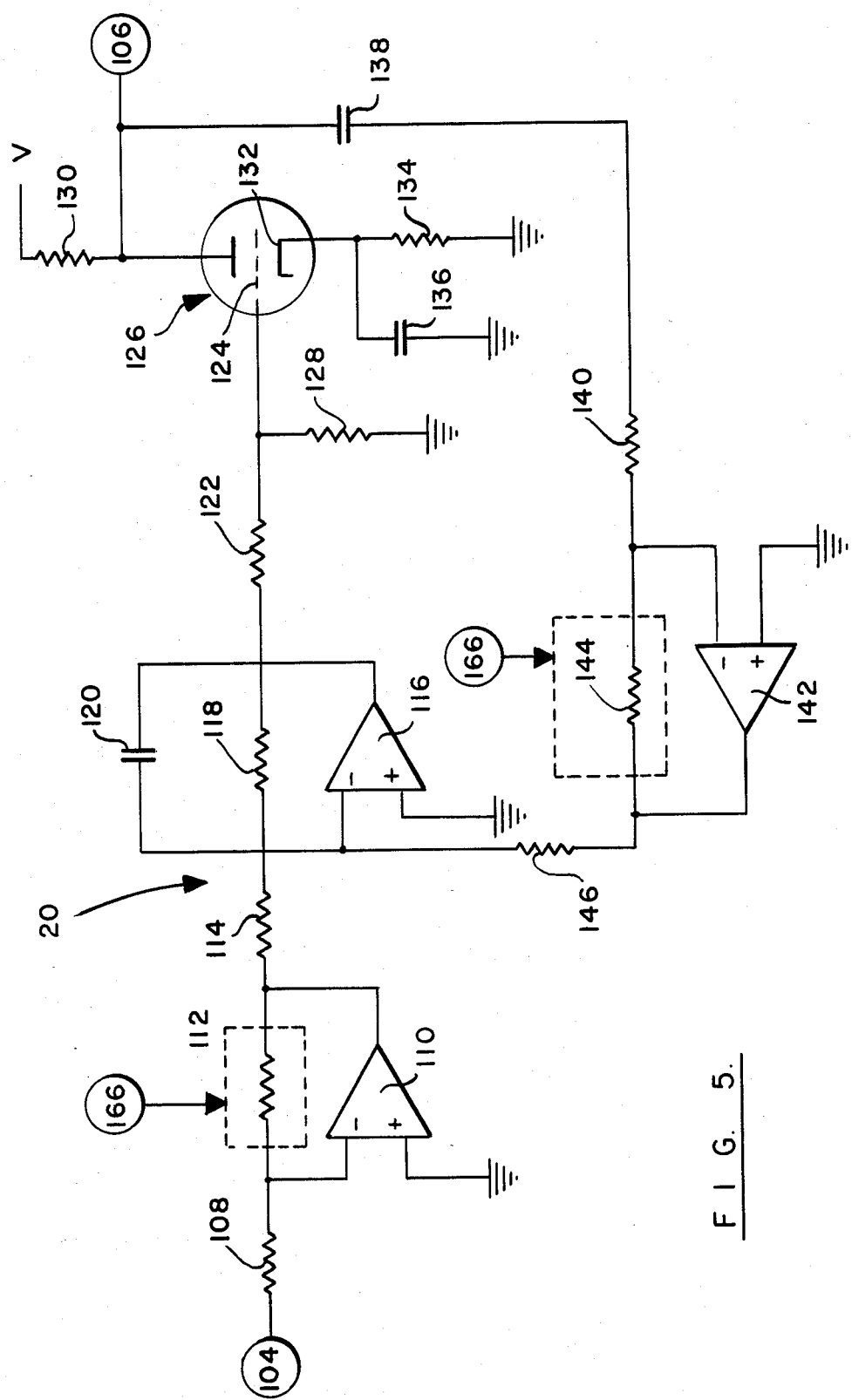
FIG. 5 is a schematic representation of variable distortion amplifier circuitry embodying aspects of the invention.

FIG. 5 illustrates in greater detail first means 20 for varying distortion of signal processed by channel 14 where signal is input thereto at a terminal depicted schematically by balloon 104 and output signal is received therefrom at a terminal depicted schematically as balloon 106. Input signal is provided via resistor 108 to the negative input terminal of a seventh differential amplifier 110 which has a positive input terminal connected to a reference signal, schematically depicted as ground in FIG. 5.

Output of seventh differential amplifier 110 is provided via feedback resistive element 112 to the negative input terminal of amplifier 110. Output of amplifier 110 is further provided via resistor 114 to the negative input terminal of eighth differential amplifier 116 having the positive input terminal thereof connected to a reference signal depicted schematically as ground in FIG. 5.

Output of eighth differential amplifier 116 is provided via resistor-capacitor 118, 120 parallel combination as feedback to the negative input terminal of eighth differential amplifier 116

Output of amplifier 116 is also provided via a voltage divider defined by resistors 122, 128 to a grid 124 of a vacuum tube designated generally 126. A supply voltage V is supplied via resistor 130 to the unnumbered plate of tube 126. Cathode 132 of tube 126 is connected to a reference signal, depicted schematically in FIG. 5 as ground, by a resistor-capacitor 134, 136 parallel combination. Output signal is provided not only at a terminal depicted schematically as balloon 106 but also via capacitor 138 and resistor 140 to the negative input terminal of ninth differential amplifier 142 which processes the output signal from tube 126 for feedback to the negative input terminal of eighth differential amplifier 116. Output from ninth differential amplifier 142 is fed to the negative input terminal thereof via feedback resistive element 144 and is provided to the negative input terminal of eight differential amplifier 116 via resistor 146. The positive input terminal of ninth differential amplifier 142 is connected to a reference signal depicted schematically as ground in FIG. 5. The signal gain between input at ballon 104 and the output of seventh differential amplifier 110 is given by the negative quotient of the value of resistive element 112 and resistor 108 and is referred to hereinafter as gain G. The signal gain between output of seventh differential amplifier 110 and the output of eighth differential amplifier 116 is given by the negative quotient of the impedance of the parallel combination of resistor 118 and capacitor 120, and resistor 114 and is referred to hereinafter as gain A. The signal gain of the vacuum tube circuit, whose input is the output of eighth differential amplifier 116 and whose output appears at balloon 106, is dependent upon a constant related to the tube 126, the resistive support circuitry associated with tube 126 and resistor 130, and is generally referred to hereinafter as gain N. The effective feedback signal gain from the output at balloon 106 to the summing amplifier defined by eighth differential amplifier 116, resistors 114, 118, 146 and capacitor 120 is given by the product of the values of resistors 114 and 144 divided by the product of the values of resistors 146 and 140 and is referred to hereinafter as gain B. Gain of variable distorions element 20 is therefore equal to $$G \frac{AN}{1 + ABN},$$

which is approximately G/B. The accuracy of the variable distortion element gain is directly related to the product ABN, accuracy and linearity being optimum when ABN is much greater than 1.

In the preferred embodiment both resistive elements 112 and 144 are resistive ladder network-analog multiplexer combinations such as depicted in FIG. 3 and each includes a bypass resistor $R_0$, as indicated in dotted lines in FIG. 3. Resistive elements 112 and 144 each preferably use identical 8:1 multiplexer elements but differing resistance values for resistors $R_1$ through $R_8$ for the rungs of the respective resistive ladder networks.

Both of the 8:1 analog-multiplexers forming portions of resistive elements 112, 144 are controlled by four common bits applied in parallel to the respective A, B, C and INHIBIT terminals of the respective analog multiplexers.

The values of resistors $R_1$ through $R_8$ associated with resistive elements 112, 144 can be chosen in such a way as to allow variable distortion at constant gain or simultaneous variable distortion and gain. Specifically, if respective values of $R_1$ through $R_8$ of resistive elements 112, 144 are the same then distortion of element 20 varies while gain remains constant. On the other hand if values of $R_1$ through $R_8$ in resistive element 112 are all equal while the values of $R_1$ through $R_8$ in resistive element 144 differ from one another, then gain and distortion of element 20 will vary simultaneously. These two approaches can be combined by suitable choice of values for $R_1$ through $R_8$ in resistive elements 112, 144 respectively.

Figure 6:
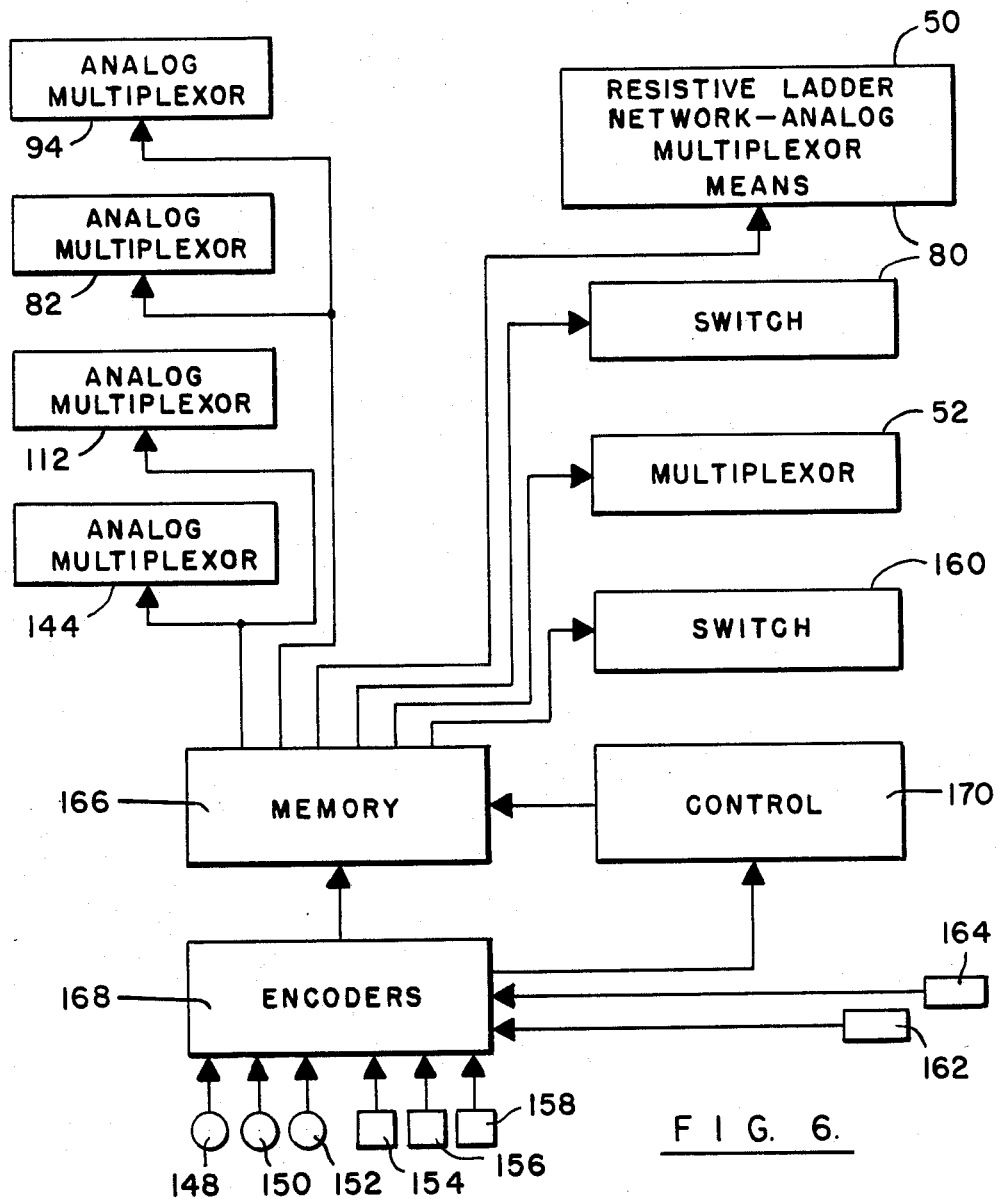
FIG. 6 is a schematic representation, in block diagram form, of input switching and signal storage circuitry embodying aspects of the invention.

FIG. 6 schematically illustrates switching means used to provide digital control signals to the 2:1 analog-multiplexer defining switch 80, means 52 and a switch 160, discussed below, and to the 8:1 analog-multiplexers constituting portions of elements 50, 82, 94, 112 and 144.

Three rotary switches 148, 150, 152, depicted schematically in FIG. 6, are preferably operated manually by the musician or listener to respectively regulate gains G and B, frequency about which filter 48 operates and amount of amplitude change introduced by parametric equalizer 18.

These first, second and third rotary switches 148, 150, 152 each preferably have nine positions and are each connected to an eight line priority encoder providing a four bit code defining position of the respective switch. The ninth position of each of the respective rotary switches causes the fourth line coming out of the encoder, which connects to the INHIBIT terminal of the respective 8:1 analog multiplexer(s) controlled by that rotary switch, to be high thereby causing the multiplexer to disconnect all of the ladder resistors associated therewith. First nine position rotary switch 148 controls signals regulating gains G and B by control of the analog-multiplexers associated with resistive elements 112, 144. Second nine position rotary switch 150 controls center frequency about which filter 48 operates by controlling the 8:1 analog-multiplexers associated with frequency control resistive elements 82, 94. Third nine position rotary switch 152 controls the amount of any boost or cut introduced by amplitude controlling means 18 by controlling the 8:1 analog-multiplexer associated with element 50.

First, second and third slide switches schematically designated as 154, 156, 158 each have a buffer circuit associated therewith and are provided to respectively control switch 80, 2:1 multiplexer 52 and switch 160, as discussed below.

A memory 166 stores digital control signals received from the encoder scheme described above, designated generally 168, associated with the aforementioned manually operated switches. Memory 166 can store at least two sets of digital control signals received from encoder scheme 168, corresponding to positions of each of switches 148, 150, 152, 154, 156 and 158 at at least two selected times.

Control means 170 is responsive to signals provided from encoders associated with switches 162 and 164 and defines the portion(s) of memory loaded with input digital control signals from the encoder scheme associated with switches 148 through 158 at a particular time and defines the portion of memory from which the input digital control signals are provided to the respective circuit elements at a selected time. Switch 162 operating via encoder scheme 168 selects the portion of memory 166 which is loaded with signals received from the encoder scheme associated with switches 148 through 158 at a selected time while switch 164 selects the portion of memory connected at a selected time to the respective circuit elements, namely means 50, potentiometer means 52, switches 80 and 160 and 8:1 multiplexers forming portions of resistive elements 82, 94, 112 and 144, all as schematically depicted in FIG. 6.

A Motorola 14532 priority encoder available from Motorola Corporation may be used as the encoder scheme to which rotary switches 148, 150 and 152 are connected. Memory 166 may be four 8 bit latches, National Semiconductor part number 74C373. The 2:1 multiplexer may be a National Semicondcutor CD4053 analog multiplexer. Tube 126 may be a Sylvania 7025 triode.

Figure 7:
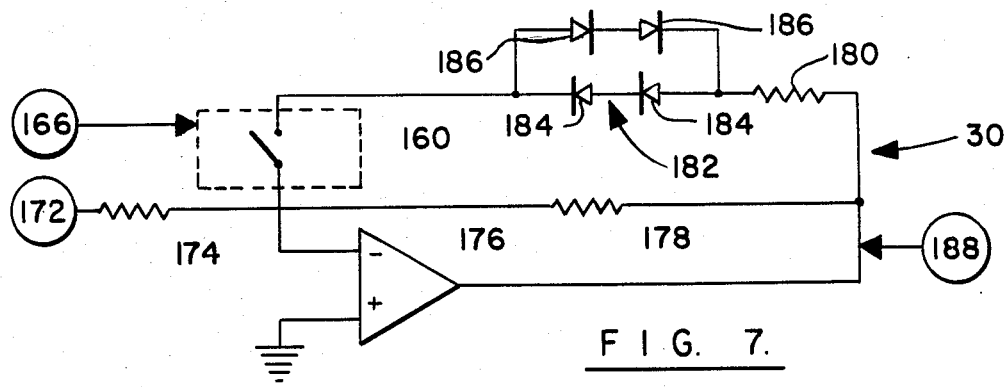
FIG. 7 is a schematic representation of circuit means, for introducing distortion of predetermined fixed amount into a signal, which embodies aspects of the invention.

FIG. 7 schematically depicts optional means for introducing a preselected fixed amount of distortion into an electrical signal, which means may be incorporated into an amplifier of the invention as indicated by dashed box 30 in FIG. 1. This optional means 30 receives input signal at an input terminal depicted schematically as balloon 172 and delivers the input via a resistor 174 to the negative input terminal of a tenth differential amplifier 176. The positive input terminal of tenth differential amplifier 176 is connected to a reference voltage, schematically depicted as ground in FIG. 7. A resistor 178 supplies output of tenth differential amplifier 176 as feedback to the negative input terminal thereof. A portion of the output of tenth differential amplifier 176 is provided via resistor 180 to a diode network, designated generally 182, having first diodes 184 connected serially as shown in FIG. 7 to receive signal from resistor 180. A second pair of diodes 186 are connected serially in the opposite sense from diodes 184, as shown in FIG. 7, also receiving signal from resistor 180. The remaining ends of the pairs of diodes 184, 186 are connected to switch 160, which in turn connects to the negative input terminal of tenth differential amplifier 176. Switch 160 selectably connects the serially connected series of elements, including diode network 182 and resistor 180, in parallel with resistor 178. Output of means 30 for introducing preselected fixed amount of distortion into an electrical signal is provided at a terminal depicted schematically as balloon 188. Preferably, resistor 178 is about ten times the value of resistor 180.

Switches 148, 150, 152, 154, 156, 158, 162, 164 in combination with memory 166 and control 170 permit programming a number of functions for controlling the amplifier circuit of the invention. Memory 166 permits the functions to be stored and recalled.

Differential amplifiers 110, 116 and 142 are all preferably integrated circuit components.

Circuitry immediately associated with vacuum tube 126 need not be changed as the amplifier is used and distortion and gain are varied.

The amplifier circuitry of the invention, while having excellent applicability to guitar amplifiers, is not limited in applicability to guitar amplifiers. Similarly, the programmable parametric equalizer provided by circuitry of FIGS. 2 and 4 and the programmable variable bandwidth variable frequency filter of FIG. 4 are not limited to guitar amplifiers.

Hand operation of switches 148 through 158 allows programming of circuit elements 50, 52, 80, 82, 94, 112 and 144 to be repeated.

Differential amplifiers 70, 76, 84 and 96 in FIG. 4, 110, 116 and 142 in FIG. 5 and 176 in FIG. 7 have been referred to respectively as third through tenth differential amplifiers since this is the order in which these differential amplifiers are discussed herein. It is to be understood that when the variable bandwidth variable frequency filter above is considered, differential amplifiers 70, 76, 84 and 96 may be considered respectively as being first through fourth differential amplifiers. Similarly, when the means 20 for introducing an adjustably preselectable amount of distortion alone is considered, differential amplifiers 110, 116 and 142 may be considered respectively as first through third differential amplifiers. Finally, when means 30 for introducing a preselected fixed amount of distortion alone is considered, differential amplifier 176 may be considered as a first differential amplifier.

In summary, each of the circuit element subcombinations separately described and claimed herein has utility as a discrete circuit in addition to utility when used in combination with the other circuit elements forming part of the programmable adjustable distortion adjustable gain amplifier of the invention.

I claim:

1. A programmable adjustable distortion amplifier, especially for amplifying music, comprising:
   (a) means for adjustably controlling amplifier gain;
   (b) means for adjustably filtering high and low frequency components of signal processed by said amplifier;
   (c) means for selectably controlling amplitude of signal processed by said amplifier within an adjustably preselected bandwidth centered about an adjustably preslected frequency, all in response to a first control signal provided thereto;
   (d) means for varying distortion and gain of signal processed by said amplifier by an adjustably preselectable amount in response to a second control signal provided thereto;
   (e) means, responsive to operator input, for generating said first and second control signals; and
   (f) memory means for storing a plurality of sets of said first and second control signals and delivering a selected one of said sets to said amplitude controlling means and distortion varying means in response to an operator supplied stimulus.

2. The amplifier of claim 1 further comprising means for delaying a portion of signal processed by said amplifier and providing said delayed portion as input to said distortion varying means.

3. A programmable adjustable distortion amplifier, especially for amplifying music, comprising:
   (a) a first amplifying channel including means for controlling gain thereof and means for adjustably filtering high and low frequency components of signal processed by said channel;
   (b) a second amplifying channel including:
      (i) means for adjustably controlling second channel gain;
      (ii) means for adjustably filtering high and low frequency components of signal processed by said second channel;
      (iii) programmable adjustable parametric equalizer means for selectably controlling amplitude of signal processed by said second channel within an adjustably preselected bandwidth centered about an adjustably preselected frequency, all in response to a first control signal provided thereto, comprising:
         (A) a first amplifier receiving second amplifying channel signal input to said equalizer;
         (B) adjustable bandwidth adjustable frequency filter means receiving output from said first amplifier, comprising:
            (1) a third amplifier receiving signal input to said filter;
            (2) a fourth amplifier receiving output from said third amplifier;
            (3) a fifth amplifier receiving output from said fourth amplifier;
            wherein output of said fifth amplifier defines said filter means output;
            (4) first frequency control resistive means connecting output of said fourth amplifier with input to said fifth amplifier;
            (5) first frequency control capacitor means connecting output of said fifth amplifier with input to said fifth amplifier;
            (6) a sixth amplifier receiving output from said fifth amplifier, output of said sixth amplifier being provided to said fourth amplifier;
            (7) bandwidth control resistive means, responsive to a fourth digital control signal, for selectably controlling the portion of said third amplifier output provided as input to said fourth amplifier, for adjustably controlling bandwidth of said filter;
            (8) second frequency control capacitor means connecting output of said sixth amplifier as feedback thereto via an input terminal thereof;
            (9) second frequency control resistive means intermediate said fifth and sixth amplifiers;
            wherein said first and second frequency control resistive means each further comprise;
               (I) a second parallel resistive ladder network receiving respective inputs to said respective frequency control resistive means on common input rails thereof;
               (II) third multiplexer means having output terminals serially connected to respective resistors of said second ladder networks for selectably providing signal received from one of said resistors in response to third digital control signal input thereto;

(C) a potentiometer means receiving output from said filter means, providing two output signals, the sum thereof equalling output from said filter means, first output from said potentiometer means being provided to said first amplifier;

(D) a second amplifier receiving said second output from said potentiometer means and signal output from said first amplifier;

(E) respective feedback resistive means connecting outputs of said respective first and second amplifiers to inputs thereof;

wherein said potentiometer means comprises:

(10) a first parallel resistive ladder network receiving output from said adjustable bandwidth adjustable frequency filter on a common input rail thereof;

(11) first multiplexer means, having input terminals serially connected to respective resistors of said ladder network, for selectably providing signal received from one of said resistors in response to a first digital control signal input thereto;

(12) second multiplexer means receiving output from said first multiplexer means, said second multiplexer means having output terminals selectably connectable to said respective first and second amplifiers in response to a second digital control signal input thereto;

wherein output of said equalizer is output of said second amplifier;

(iv) first means for varying distortion and gain of signal processed by said second channel by an adjustably preselectable amount in response to second control signal provided thereto, comprising:

(F) seventh amplifier means receiving signal from said programmable adjustable parametric equalizer means;

(G) means for combining output of said seventh amplifier means with a second signal;

(H) eighth amplifier means receiving output of said combining means;

(I) vacuum tube amplifier means receiving output of said eighth amplifier means on a grid element thereof;

wherein output of said vacuum tube amplifier defines output of said first means for varying distortion and gain of signal processed by said second channel;

(J) variable gain feedback amplifier means receiving signal from said vacuum tube amplifier means;

wherein said feedback amplifier means output is said second signal;

(K) first feedback resistive gain control means providing first amplifier means output at the input terminal thereof;

(L) second feedback resistive distortion control means providing feedback amplifier output at the input terminal thereof;

wherein said first and second feedback resistive control means each comprise:

(13) a third parallel resistive ladder network receiving input on a common rail thereof;

(14) fourth multiplexer means, having input terminals serially connected to respective resistors of said ladder network, for selectably providing signal received from one of said resistors of said ladder network in response to a fifth digital control signal input thereto;

(v) means for delaying a portion of signal processed by said second channel and providing said delayed portion to said second channel downstream of said amplitude controlling means but upstream of said distortion varying means;

(c) means for introducing a preselected fixed amount of distortion into signal input to said programmable adjustable parametric equalizer, comprising:

(M) a ninth amplifier receiving said input electrical signal;

(N) feedback resistive means for connecting output of said ninth amplifier as input thereto;

(O) a serially connected series of elements connected in parallel with said resistive feedback means associated with said ninth amplifier, comprising:

(15) resistive means receiving output from said ninth amplifier;

(16) first diode means receiving output of said resistive means which receives said ninth amplifier output;

(17) second diode means in parallel with said first diode means, with orientation opposite that of said first diode means, and

(18) switching means for selectably connecting said serially connected series of elements in parallel with said feedback resistive means associated with said ninth amplifier, in response to a sixth digital control signal;

(d) means for combining output signals of said first and second channels and feeding same to adjustable gain control means providing input to a power amplifier driving audio speakers;

(e) switching means, responsive to operator input, for generating said first through sixth digital control signals for respective input to said first multiplexer associated with said parametric equalizer, said second multiplexer associated with said parametric equalizer, said two third multiplexers associated with said variable filter portion of said parametric equalizer, said bandwidth control resistive means associated with said variable filter, said two fourth multiplexers respectively associated with said resistive gain control means and said resistive distortion control means of said first means for varying distortion and gain of said second channel signal and said switch for selectably connecting said serially connected series of elements in parallel with said resistive means associated with said means for introducing a fixed amount of distortion into said second channel signal, said first through fourth digital control signals thereby defining the adjustably preselected bandwidth and frequency about which said bandwdith is centered for operation of said parametric equalizer and variable bandwidth filter, said fifth digital control signal thereby defining the adjustably preselectable amount of distortion and gain introduced to said second channel signal by said first means for varying distortion and gain of signal processed by said second channel, said sixth digital control signal thereby defining whether distortion of said preselected fixed amount is introduced into signal processed by said second channel;

(f) memory means, interposed between said switching means and (1) said first, second, third and fourth multiplexers, (2) said bandwidth control resistive means associated with said variable filter and (3) said switch associated with said means for introducing a fixed amount of distortion into said second channel signal, for storing a plurality of sets of said first through sixth digital control signals and delivering the individual digital control signals constituting a selected one of said sets to said respective first, second, third and fourth multiplexers, said bandwidth control resistive means associated with said variable filter and said switch associated with said means for introducing a fixed amount of distortion into said second channel signal, in response to an operator supplied stimulus.

4. A programmable adjustable distortion amplifier, especially for amplifying music comprising:

(a) a first amplifier channel including means for controlling gain thereof and means for adjustably filtering high and low frequency components of signal processed by said channel;

(b) a second amplifying channel including:
 (i) means for adjustably controlling second channel gain;
 (ii) means receiving signal from means for adjustably controlling second channel gain, for adjustably filtering high and low frequency components of said signal which is processed by said second channel;
 (iii) means for selectably controlling ampliude of said signal received from said means for adjustably filtering high and low frequency components of said signal which is processed by said second channel, within an adjustably preselected bandwidth entered about an adjustably preselected frequency, in response to a first control signal provided thereto;
 (iv) first means for varying distortion and gain of said signal received from said means for selectably controlling amplitude of said signal, which is processed by said second channel, by an adjustably preselectable amount in response to a second control signal provided thereto;
 (v) means for delaying a portion of said signal received from said first means for varying distortion and gain of said signal, which is processed by said second channel, downstream of said amplitude controlling means but upstream of said distortion varying means;

(c) means for combining output signals of said first and second channels and feeding same to adjustable gain control means providing input to an amplifier for driving audio speakers;

(d) means, responsive to operator input, for generating said first and second control signals;

(e) memory means for storing a plurality of sets of said first and second control signals and delivering a selected one of said sets to said amplitude controlling and distortion varying means.

5. The programmable adjustable distortion amplifier of claim 4 wherein said means for selectably controlling amplitude of signal processed by said second channel within an adjustably preselected bandwidth centered about an adjustably preselected frequency is a programmable adjustable parametric equalizer comprising:

(a) a first amplifier receiving second channel signal input to said equalizer;

(b) adjustable bandwidth adjustable frequency filter means receiving output from said first amplifier;

(c) potentiometer means receiving output from said filter means, providing two output signals, the sum thereof equaling output from said filter means, first output from said filter means, first output from said potentiometer means being provided to said first amplifier;

(d) a second amplifier receiving second output from said potentiometer means and signal output from said first amplifier;

(e) respective feedback resistive means connecting output of said respective first and second amplifiers to inputs thereof;

wherein said potentiometer means comprises:
 (i) a resistive ladder network receiving output from said adjustable bandwidth adjustable frequency filter on a common input rail thereof;
 (ii) first multiplexer means, having input terminals connected to respective resistors of said ladder network, for selectably providing signal received from one of said resistors in response to a first digital control signal input thereto;
 (iii) second multiplexer means receiving output from said first multiplexer means, said second multiplexer means having output terminals selectably connectable to said respective first and second amplifiers in response to a second digital control signal input thereto;

wherein output of said equalizer is output of said second amplifier;

(f) switching means generating signals for controlling said first and second multiplexer means;

(g) encoder means for converting said switching means generated signals to digital format signals corresponding to said first and second digital control signals;

(h) memory means for storing a plurality of sets of said digital format signals;

(i) control means for providing to said first and second multiplexer means from said memory a set of said digital format signals as said first and second digital control signals;

wherein said first and second digital control signals are components of said first control signal.

6. The programmable adjustable distortion amplifier of claim 5 wherein said adjustable bandwidth adjustable frequency filter means comprises:

(a) a third amplifier receiving signal input to said filter;

(b) a fourth amplifier receiving output from said third amplifier;

(c) a fifth amplifier receiving output from said fourth amplifier;

wherein output of said fifth amplifier defines said filter output;

(d) first frequency control resistive means connecting output of said fourth amplifier with input to said fifth amplifier;

(e) first frequency control capacitor means connecting output of said fifth amplifier with input to said fifth amplifier;

(f) a sixth amplifier receiving output from said fifth amplifier, output of said sixth amplifier being provided to said fourth amplifier;

(g) bandwidth control resistive means, responsive to a fourth digital control signal, for selectably controlling the portion of said third amplifier output provided as input to said fourth amplifier, for adjustably controlling bandwidth of said filter;

(h) second frequency control capacitor means connecting output of said sixth amplifier as feedback thereto via an input terminal thereof;

(i) second frequency control resistive means intermediate said fifth and sixth amplifiers;

wherein said first and second frequency control resistive means each further comprise:

(1) a resistive ladder network receiving respective inputs to said respective frequency control resistive means on common input rails thereof;

(2) third multiplexer means having input terminals connected to respective resistors of said ladder network for selectably providing signal received from one of said resistors in response to a third digital control signal input thereto;

wherein said switching means further includes means for generating input signals for controlling (1) said multiplexer means of said first and second frequency control resistive means and (2) said bandwidth control resistive means;

wherein said encoder means converts said switching means generated signals to digital format signals corresponding to said third and fourth digital control signals;

wherein said control means further provides a set of said digital format signals as said third and fourth digital control signals from said memory means to said multiplexer means of said respective first and second frequency control resistive means and said bandwidth control resistive means.

7. The equalizer of claim 6 wherein said switching means includes at least one manually actuated switch.

8. The programmable adjustable distortion amplifier of claim 4 wherein said first means for varying distortion and gain of signal processed by said second channel by an adjustably preselected amount comprises:

(a) first amplifier means receiving second channel signal input to said means for varying distortion and gain;

(b) means for combining output of said first amplifier means with a second signal;

(c) second amplifier means receiving output of said combining means;

(d) vacuum tube amplifier means receiving output of said second amplifier means on a grid element thereof;

wherein output of said vacuum tube amplifier means defines output of said first means for varying distortion and gain;

(e) variable gain feedback amplifier means receiving signal from a plate of said vacuum tube amplifier means;

wherein said feedback amplifier means output is said second signal;

(f) first feedback resistive gain control means providing first amplifier means output at the input terminal thereof;

(g) second feedback resistive distortion control means providing feedback amplifier output at the input terminal thereof;

wherein said first and second feedback resistive control means each comprise:

(1) a resistive ladder network receiving input on a common rail thereof;

(2) multiplexer means, having input terminals connected to respective resistors of said ladder network and having by-pass resistive means connecting said common input rail of said resistive ladder network with output of said multiplexer means, for selectably providing, at said multiplexer means output, signal received from one of said resistors of said ladder network in response to said second control signal.

9. The programmable adjustable distortion amplifier of claim 4 further comprising circuit means for introducing a preselected fixed amount of distortion into electrical signal processed by said second channel, including:

(a) an amplifier receiving as input said electrical signal;

(b) feedback resistive means for connecting output of said amplifier to said amplifier input;

(c) a serially connected series of elements, connected in parallel with said feedback resistive means comprising:

(i) second resistive means receiving output from said amplifier;

(ii) first diode means receiving output of said second resistive means;

(iii) second diode means connected in parallel with said first diode means, with orientation opposite that of said first diode means; and (iv) switching means for selectably connecting said serially connected series of elements in parallel with said feedback resistive means.

10. A programmable adjustable parametric equalizer comprising:

(a) a first amplifier receiving signal input to said equalizer;

(b) adjustable bandwidth adjustable frequency filter means receiving output from said first amplifier;

(c) potentiometer means receiving output from said filter means, providing two output signals, referred to as first and second outputs, the sum thereof equalling output from said filter means, first output from said potentiometer means being provided to said first amplifier;

(d) a second amplifier receiving said second output from said potentiometer means and signal output from said first amplifier;

(e) feedback resistive means connecting output of said respective first and second amplifiers to inputs thereof;

wherein said potentiometer means comprises:

(i) a resistive ladder network receiving output from said adjustable bandwidth adjustable frequency filter on a common input rail thereof;

(ii) first multiplexer means, having input terminals connected to respective resistors of said ladder network, for selectably providing signal received from one of said resistors in response to a first digital control signal input thereto;

(iii) second multiplexer means receiving output from said first multiplexer means, said second multiplexer means having output terminals selectably connectable to said respective first and second amplifiers in response to a second digital control signal input thereto;

wherein output of said equalizer is output of said second amplifier;

(f) switching means generating signals for controlling said first and second multiplexer means;

(g) encoder means for converting said switching means generated signals to digital format signals corresponding to said first and second digital control signals;

(h) memory means for storing a plurality of sets of said digital format signals;

(i) control means for providing a set of said digital format signals as said first and second digital control signals to said first and second multiplexer means from said memory means.

11. The equalizer of claim 10, wherein said adjustable bandwidth adjustable frequency filter means comprises:

(a) a third amplifier receiving signal input to said filter;

(b) a fourth amplifier receiving output from said third amplifier;

(c) a fifth amplifier receiving output from said fourth amplifier;

wherein output of said fifth amplifier defines filter means output;

(d) first frequency control resistive means connecting output of said fourth amplifier with input to said fifth amplifier;

(e) first frequency control capacitor means connecting output of said fifth amplifier with input to said fifth amplifier.

(f) a sixth amplifier receiving output from said fifth amplifer, output of said sixth amplifier being provided to said fourth amplifier;

(g) bandwidth control resistive means, responsive to a fourth digital control signal, for selectably controlling the portion of said third amplifier output provided as input to said fourth amplifier, for adjustably controlling bandwidth of said filter;

(h) second frequency control capacitor means connecting output of said sixth amplifier as feedback thereto via an input terminal thereof;

(i) second frequency control resistive means intermediate said fifth and sixth amplifiers;

wherein said first and second frequency control resistive means each further comprise:

(1) a resistive ladder network receiving inputs to said respective frequency control resistive means on common input rails thereof;

(2) third multiplexer means having input terminals connected to respective resistors of said ladder network for selectably providing signal received from one of said resistors in response to a third digital control signal input thereto;

wherein said switching means further includes means for generating input signals for controlling (1) said multiplexer means of said first and second frequency control resistive means and (2) said bandwidth control resistive means;

wherein said encoder means converts said switching means generated signals to digital format signals corresponding to said third and fourth digital control signals; wherein said control means further provides from said memory means to said multiplexer means of said respective first and second frequency control resistive means and said bandwidth control resistive means a set of said digital format signals as said third and fourth digital control signals.

12. The equalizer of claim 11 wherein said switching means includes at least one manually actuated switch.

13. A programmable adjustable bandwidth adjustable frequency filter comprising:

(a) a first amplifier receiving signal input to said filter;

(b) a second amplifier receiving output from said first amplifier;

(c) a third amplifier receiving output from said second amplifier; wherein output of said third amplifier defines said filter output;

(d) first frequency control resistive means connecting output of said second amplifier with input to said third amplifier;

(e) first frequency control capacitor means connecting output of said third amplifier with input thereto;

(f) a fourth amplifier receiving output from said third amplifier, output of said fourth amplifier being provided to said second amplifier;

(g) bandwidth control resistive means, responsive to a second digital control signal, for selectably controlling the portion of said first amplifier output provided as input to said second amplifier, for adjustably controlling bandwidth of said filter;

(h) second frequency control capacitor means connecting output of said fourth amplifier as feedback thereto via an input terminal thereof;

(i) second frequency control resistive means intermediate said third and fourth amplifiers; wherein said first and second frequency control resistive means each further comprise:

(1) a resistive ladder network receiving respective inputs to said respective frequency control resistive means on common input rails thereof;

(2) multiplexer means having input terminals connected to respective resistors of said ladder network for selectably providing signal received from one of said resistors in response to a first digital control signal input thereto;

(j) switching means generating signal for controlling said multiplexer means and said bandwidth control resistive means;

(k) encoder means for converting said switching means generated signals to digital format signals corresponding to said first and second digital control signals;

(l) memory means for storing a plurality of sets of said digital format signals;

(m) control means for providing to said multiplexer means and said bandwidth control resistive means from said memory means a set of said digital format signals as said first and second digital control signals;

14. The filter of claim 13 wherein said switching means includes at least one manually actuated switch.

15. A circuit for introducing a selectably variable amount of distortion into an electrical signal input thereto comprising;

(a) first amplifier means receiving said input signal;

(b) means for combining output of said first amplifier means with a second signal;

(c) second amplifier means receiving output of said combining means;

(d) vacuum tube amplifier means receiving output of said second amplifier means on a grid element thereof;

wherein output of said vacuum tube amplifier means defines output of said circuit;

(e) variable gain feedback amplifier means receiving signal from a plate of said vacuum tube amplifier means;

wherein said feedback amplifier means output is said second signal;

(f) first feedback resistive gain control means providing first amplifier means output at the input terminal thereof;

(g) second feedback resistive distortion control means providing feedback amplifier output at the input terminal thereof;

wherein said first and second feedback resistive control means comprise:

(1) a resistive ladder network receiving input on a common rail thereof;

(2) multiplexer means, having input terminals connected to respective resistors of said ladder network for selectably providing signal received from one of said resistors of said ladder network in response to a digital control signal input thereto;

(h) switching means generating signals for controlling respective multiplexers of said first and second feedback resistive control means;

(i) encoder means for converting said switching means generated signals to digital format signals corresponding to said digital control signals;

(j) memory means for storing a plurality of sets of said digital format signals;

(k) control means for providing from said memory means to said respective multiplexer means of said first and second feedback resistive means a set of said digital format signals as said digital control signal.

16. The circuit of claim 15 wherein said digital control signal is supplied commonly to said respective multiplexer means.

17. The circuit of claim 15 wherein said switching means includes at least one manually actuated switch.

18. The circuit of claim 16 wherein said switching means includes at least one manually actuated switch.

* * * * *